(12) United States Patent
Yoshida et al.

(10) Patent No.: US 11,862,507 B2
(45) Date of Patent: Jan. 2, 2024

(54) ROBOT SYSTEM, AND SLIP DETERMINATION METHOD

(71) Applicants: KAWASAKI JUKOGYO KABUSHIKI KAISHA, Kobe (JP); Kawasaki Robotics (USA), INC., Wixom, MI (US)

(72) Inventors: Masaya Yoshida, Himeji (JP); Avish Ashok Bharwani, Santa Clara, CA (US); Simon Jeyapalan, Newark, CA (US)

(73) Assignees: KAWASAKI JUKOGYO KABUSHIKI KAISHA, Kobe (JP); KAWASAKI ROBOTICS (USA), INC, Wixom, MI (US)

( * ) Notice: Subject to any disclaimer, the term of this patent is extended or adjusted under 35 U.S.C. 154(b) by 618 days.

(21) Appl. No.: 17/105,479

(22) Filed: Nov. 25, 2020

(65) Prior Publication Data

US 2022/0165607 A1    May 26, 2022

(51) Int. Cl.
*H01L 21/687* (2006.01)
*H01L 21/67* (2006.01)

(52) U.S. Cl.
CPC .. *H01L 21/68707* (2013.01); *H01L 21/67259* (2013.01); *H01L 21/67265* (2013.01); *G05B 2219/41136* (2013.01)

(58) Field of Classification Search
CPC .............. H01L 21/68707; H01L 21/67259
See application file for complete search history.

(56) References Cited

U.S. PATENT DOCUMENTS

| | | |
|---|---|---|
| 2007/0229015 A1 | 10/2007 | Yoshida et al. |
| 2015/0019004 A1 | 1/2015 | Hiroki et al. |
| 2015/0214091 A1* | 7/2015 | Rodnick ............ B25J 9/1656 |
| | | 700/228 |

FOREIGN PATENT DOCUMENTS

JP            5600703 B2     10/2014

* cited by examiner

*Primary Examiner* — Nicholas Kiswanto
*Assistant Examiner* — Christopher A Buksa
(74) *Attorney, Agent, or Firm* — METROLEX IP LAW GROUP, PLLC

(57) ABSTRACT

A robot system according to one or more embodiments may include a robot, and a control part. The robot may include one or more joints driven by an electric motor, and can hold a wafer by a holding part. The control part gives commands to the robot for control. When the robot holds and transports the wafer with the holding part, the control part performs, based on information about the electric motor, at least one of the following: determining whether slippage has occurred between the holding part and the wafer; and estimating an amount of slippage of the wafer relative to the holding part.

6 Claims, 7 Drawing Sheets

POSITIONAL DEVIATION

NO SLIPPAGE OCCURRED

──── THE POSITIONAL DEVIATION OF THE ELECTRIC MOTOR
THAT DRIVES THE JOINT OF THE SECOND AXIS c2

US 11,862,507 B2

ROBOT SYSTEM, AND SLIP DETERMINATION METHOD

TECHNICAL FIELD

The present invention relates to detection of slippage occurring between a wafer and a holding part of a robot when the wafer is transported by the robot.

BACKGROUND ART

Conventionally, a system can detect a positional deviation of a semiconductor wafer while it is being transported by the robot, has been known. Patent Literature 1 (Japanese Patent No. 5600703, hereinafter, PTL 1) discloses this kind of system.

PTL 1 discloses a system for processing substrates (wafers). The system includes a transport unit for transporting the substrate.

In the configuration of PTL 1, a position detection sensor is provided at a position between a transfer source position and a transfer destination position of the substrate (wafer) is transported by the transport unit. PTL 1 discloses that when the substrate is transported, the position of the substrate during transport is detected by the position detection sensor. Based on the detected position of the substrate, the transfer destination position set at the start of the substrate transfer is corrected.

SUMMARY OF THE INVENTION

Problems to be Solved by the Invention

In the configuration of PTL 1, an additional position detection sensor needs to be specially provided, which causes complexity of the configuration and an increase in cost. In addition, in the configuration of PTL 1, although the deviation of the wafer can be detected at the time when the wafer passes the position detection sensor, the occurrence of the deviation (slip) of the wafer cannot be detected immediately.

The present invention has been made in view of the circumstances described above, an object of the present invention is to provide a robot system capable of immediately determining the occurrence of slippage between the wafer and a holding part of a robot without additional detection device.

Means for Solving the Problems and Effects Thereof

Problems to be solved by the present invention are as described above, and next, means for solving the problems and effects thereof will be described.

According to a first aspect of the present invention, a robot system with the following configuration is provided. That is, the robot system includes a robot, and a control part. The robot has one or more joints driven by an electric motor, and can hold a wafer by a holding part. The control part gives commands to the robot to control it. When the robot holds and transports the wafer with the holding part, the control part performs at least one of the following: determining whether or not slippage has occurred between the holding part and the wafer bases on information about the electric motor, and estimating an amount of slippage of the wafer relative to the holding part.

This allows immediate determination of the occurrence of slippage between the holding part of the robot and the held wafer and/or instant estimation of the slippage amount without the additional detection device and without the need for special movements of the robot.

According to a second aspect of the present invention, a robot system with the following configuration is provided. That is, the robot system includes a robot, a control part, and a positional displacement detection device. The robot has one or more joints driven by an electric motor, and can hold a wafer by a holding part. The control part gives commands to the robot to control it. The positional displacement detection device can detect a positional deviation of the wafer. The control part switches a transfer route of the wafer between a first route and a second route bases on a determination result of whether or not slippage has occurred between the holding part and the wafer during a transfer of the wafer, or bases on a slippage amount, the first route which does not go through the positional displacement detection device, the second route which dose go through the positional displacement detection device.

Thus, according to the transfer status of the wafer, the transfer route can be reasonably planned so that the wafer can be transferred efficiently.

According to a third aspect of the present invention, the following slip determination method is provide. That is, the slip determination method determines occurrence of slippage between a wafer and a holding part in a robot system including a robot and a control part. The robot has one or more joints driven by an electric motor, and capable of holding the wafer by the holding part. The control part gives commands to the robot to control it. The slip determination method includes a first step and a second step. In the first step, the control part acquires information about the electric motor when the wafer is held and transported by the holding part. In the second step, the control part determines whether or not slippage has occurred bases on the information.

Accordingly, the occurrence of slippage between the holding part of the robot and the held wafer can be immediately determined without the additional detection device and without requiring the special movements of the robot.

Effects of Invention

According to the present invention, the occurrence of slippage between the wafer and the holding part of the robot can be immediately determined without the additional detection device.

EMBODIMENT FOR CARRYING OUT THE INVENTION

Figure 1:
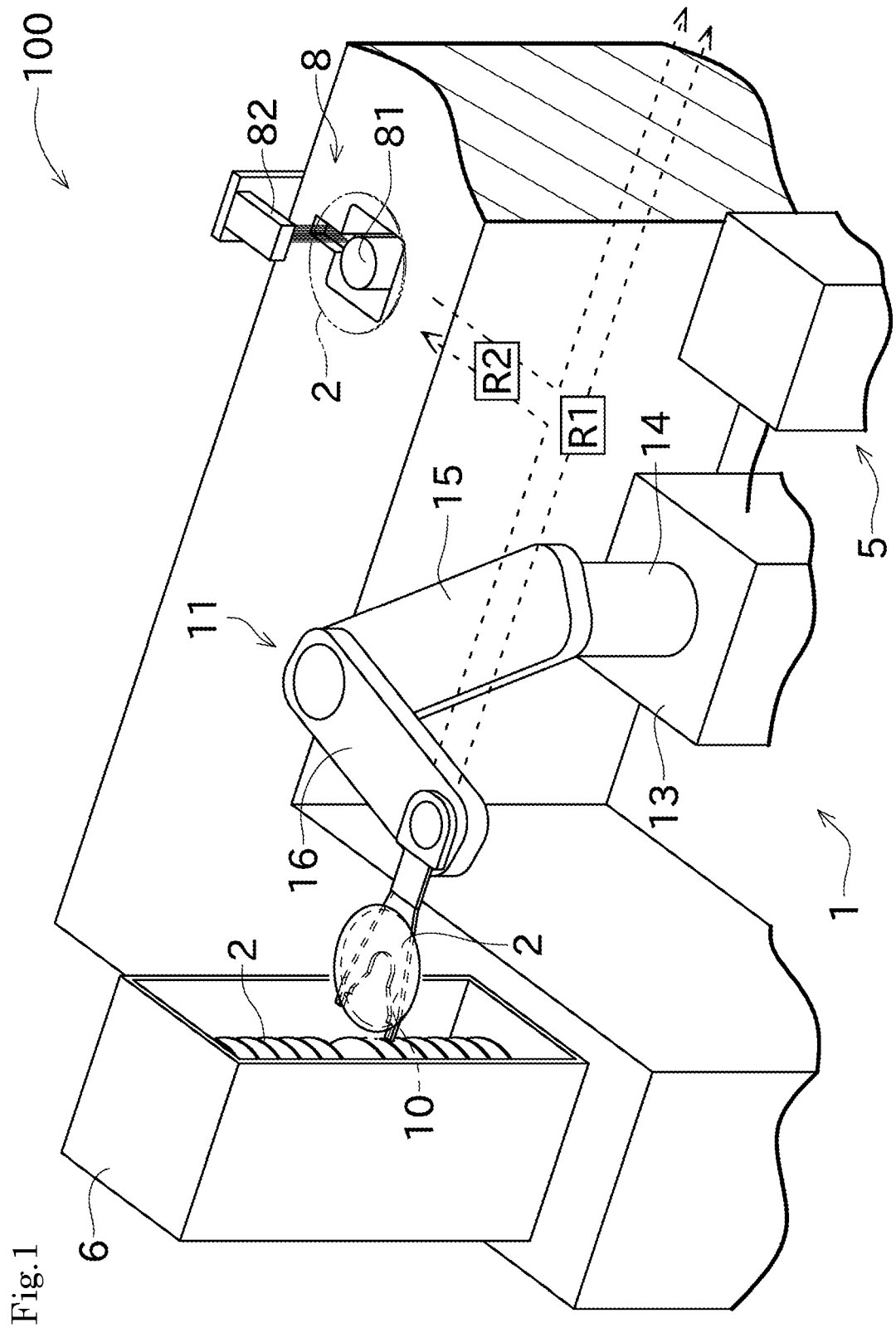
FIG. 1 is a perspective view showing a configuration of the robot system according to an embodiment of the present invention.
Figure 2:
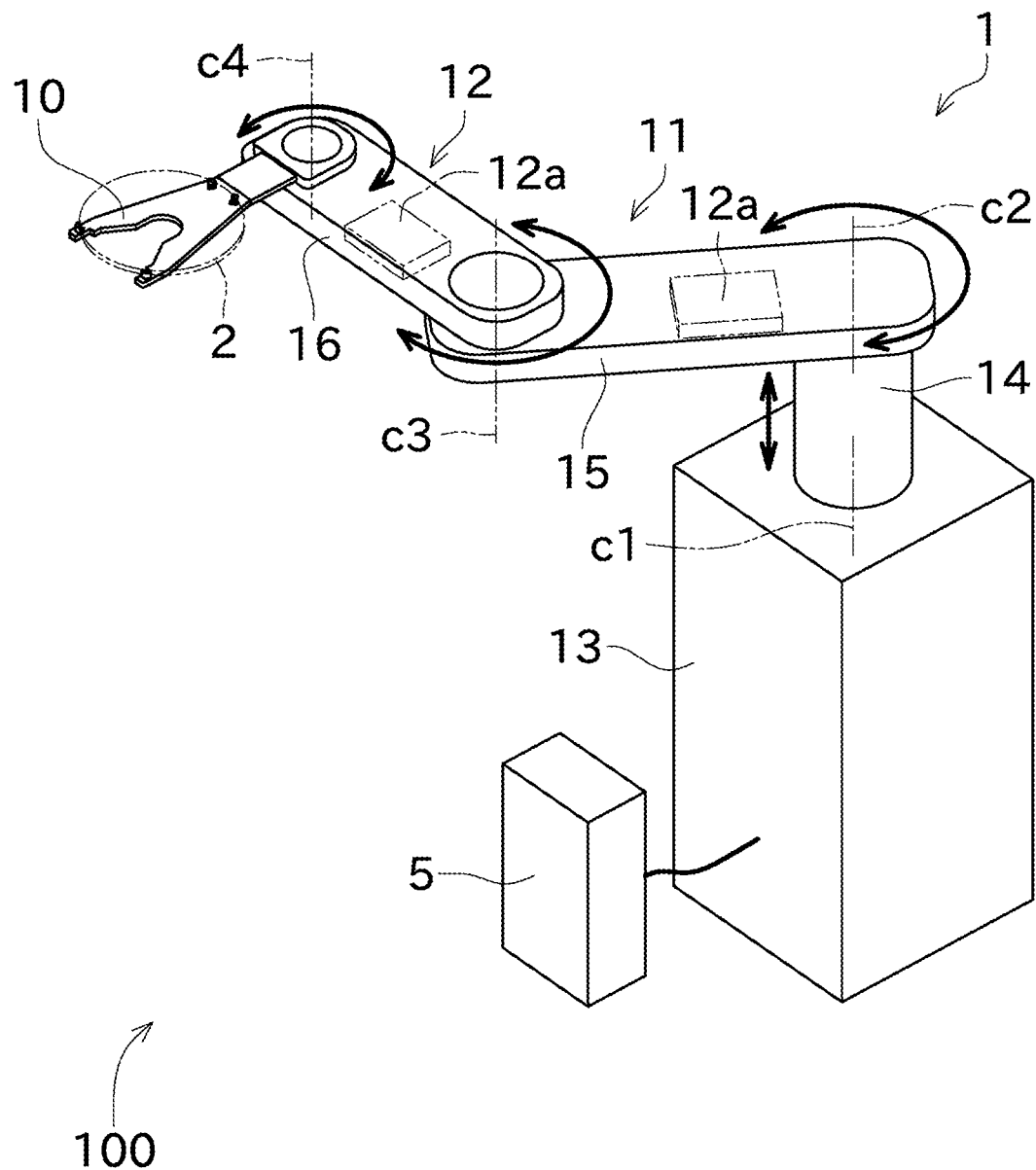
FIG. 2 is a perspective view showing a configuration of the robot in detail.
Figure 3:
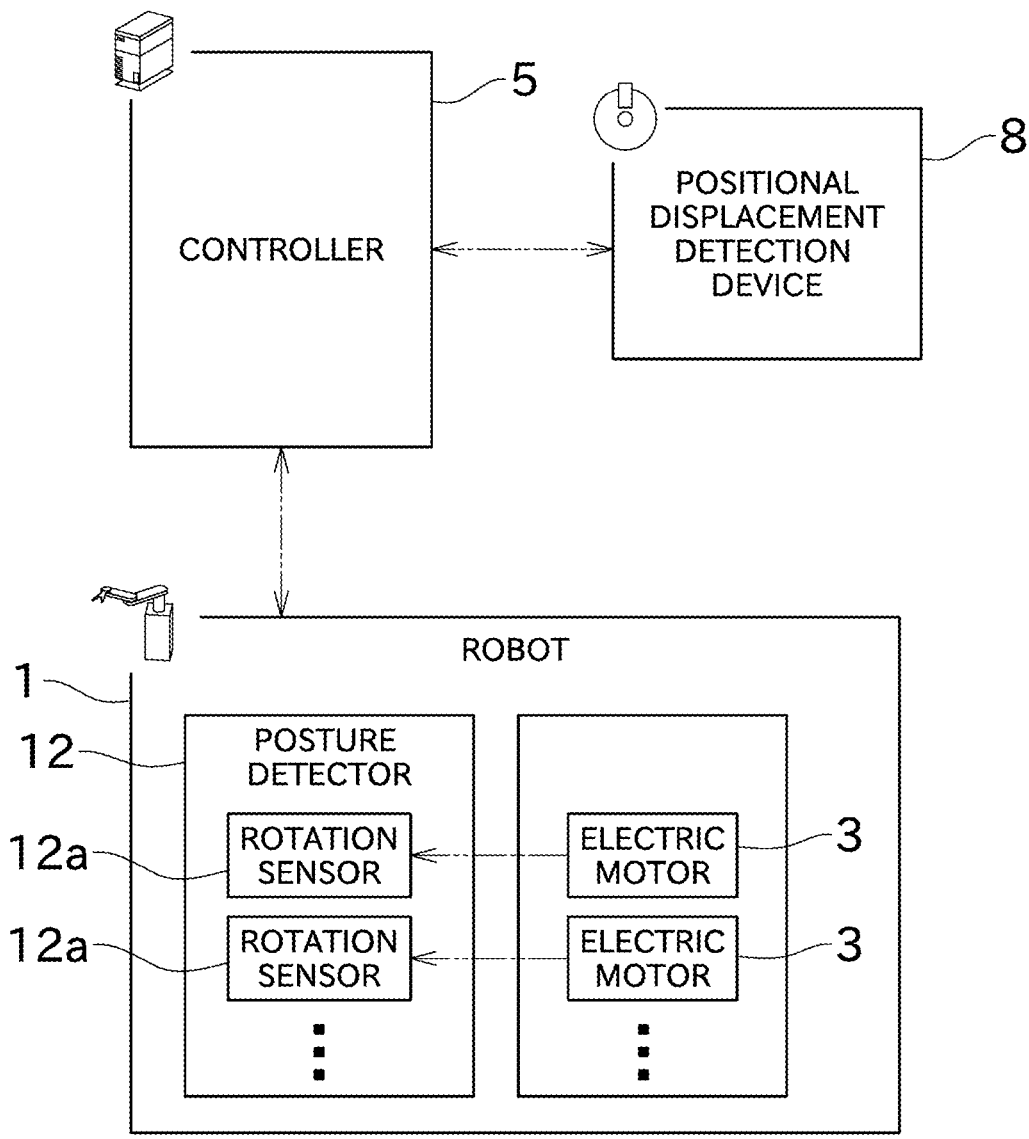
FIG. 3 is a block diagram showing a configuration of a part of the robot system.
Figure 4A:
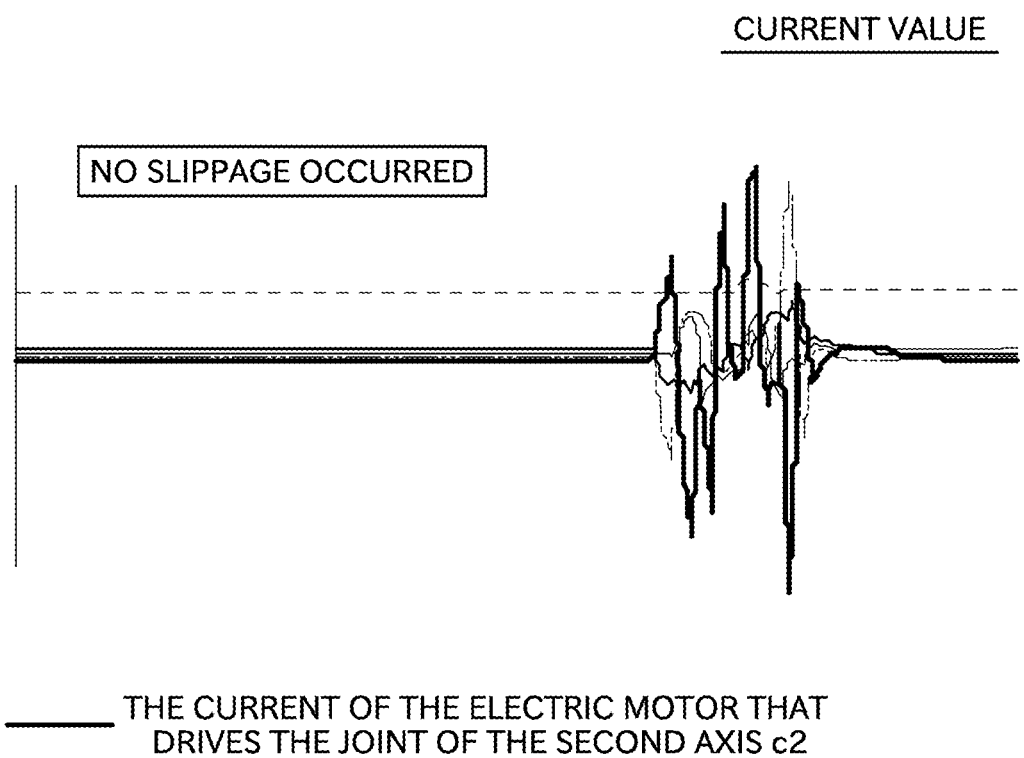
FIG. 4A and FIG. 4B are graphs showing the respective current values of the electric motors for driving the respective parts of the robot.
Figure 4B:
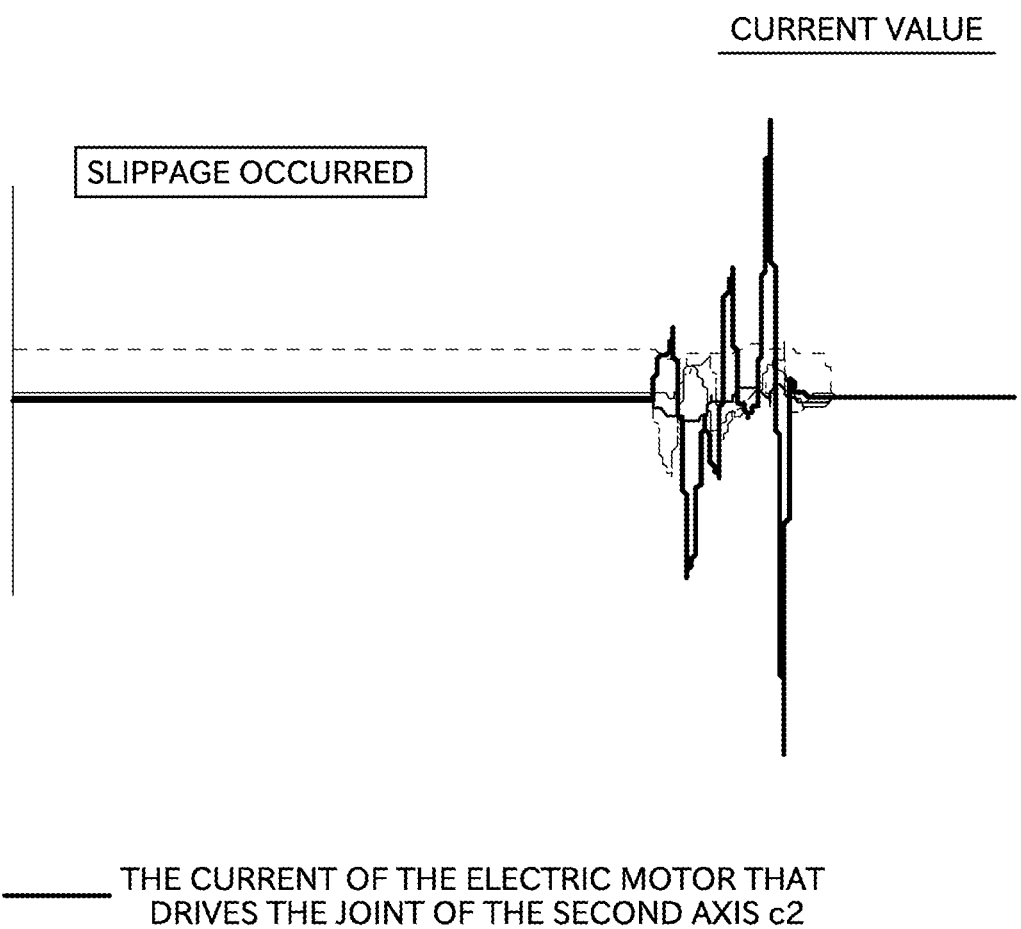
Figure 5A:
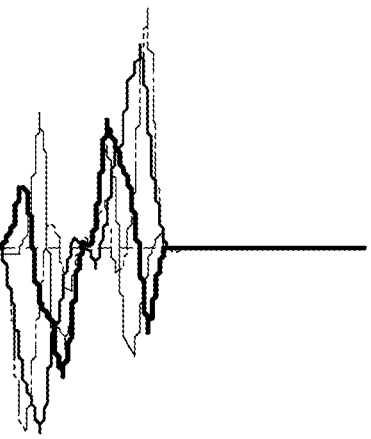
FIG. 5A and FIG. 5B are graphs showing the respective position deviations of the electric motors for driving the respective parts of the robot.
Figure 5B:
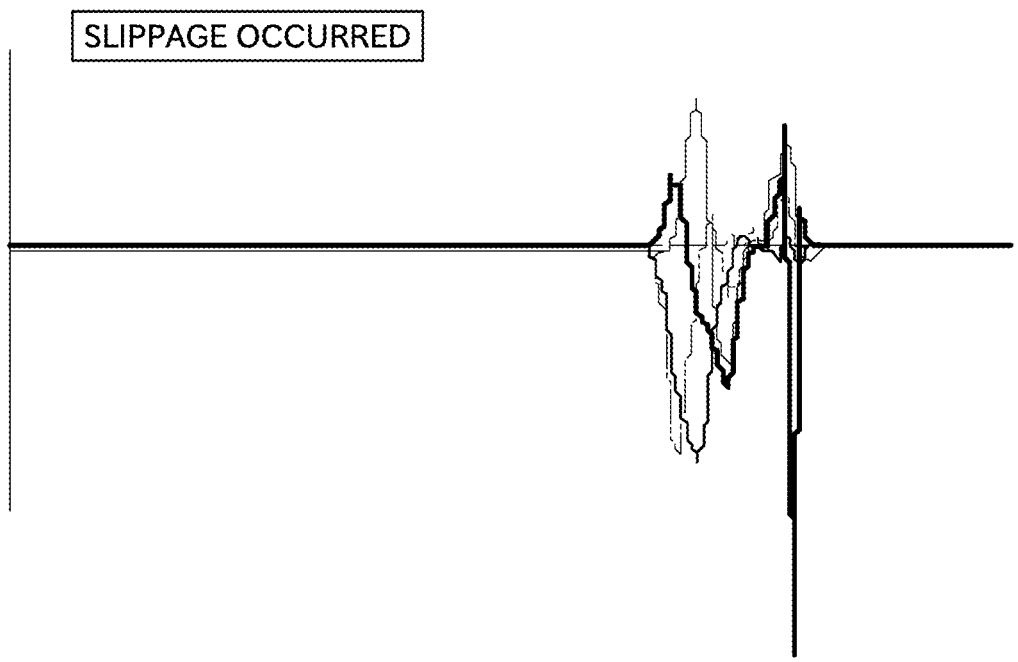

Next, an embodiment of the present invention will be described with reference to drawings. FIG. 1 is a perspective view showing a configuration of the robot system 100 according to an embodiment of the present invention. FIG. 2 is a perspective view showing a configuration of the robot 1 in detail. FIG. 3 is a block diagram showing a configuration of a part of the robot system 100. FIG. 4A and FIG. 4B are graphs showing the respective current values of the electric motors for driving the respective parts of the robot 1. FIG. 5A and FIG. 5B are graphs showing the respective position deviations of the electric motors for driving the respective parts of the robot 1.

The robot system 100 shown in FIG. 1 is a system that allows the robot 1 to work in a work space such as a clean room.

The robotic system 100 is applied to a semiconductor processing system (not shown). In the semiconductor processing system, various predetermined processes are performed on the wafer 2 to be processed. The robot system 100 is used to transport the wafer 2 between various devices included in the semiconductor processing system.

The robot system 100 includes the robot 1, the controller (control part) 5, and the positional displacement detection device 8.

The robot 1 functions as a wafer transfer robot for conveying a wafer stored in a storage device 6. In this embodiment, the robot 1 is achieved by a SCARA type horizontal articulated robot. SCARA is an abbreviation for Selective Compliance Assembly Robot Arm.

As shown in FIG. 2, the robot 1 includes a hand (holding part) 10, a manipulator 11, and a posture detector 12.

The hand 10, which is a kind of end effector, is generally formed in a V-shape or a U-shape in a plan view. The hand 10 is supported by a tip of the manipulator 11 (specifically, a second link 16 which will be described later). The hand 10 rotates around a fourth axis c4 extending in the vertical direction with respect to the second link 16.

The manipulator 11 mainly includes a base 13, a lifting shaft 14, and a plurality of links (a first link 15 and the second link 16).

The base 13 is fixed to the ground (for example, a floor of the clean room). The base 13 functions as a base member that supports the lifting shaft 14.

The lifting shaft 14 moves in the vertical direction with respect to the base 13. With such lifting, the heights of the first link 15, the second link 16, and the hand 10 can be changed. The lifting shaft 14, with respect to base 13, rotates around a first axis c1 extending in the vertical direction. Accordingly, the posture of the first link 15 (and second link and the hand 10) supported by the lifting shaft 14 can be changed within a horizontal plane.

The first link 15 is supported on top of the lifting shaft 14. The first link 15, with respect to the lifting shaft 14, rotates around a second axis c2 extending in the vertical direction. Accordingly, a posture of the first link 15 can be changed within the horizontal plane.

The second link 16 is supported by a tip of the first link 15. The second link 16, with respect to the first link 15, rotates around a third axis c3 extending in the vertical direction. Accordingly, a posture of the second link 16 can be changed within the horizontal plane.

The robot 1 of this embodiment includes actuators that individually rotate each part (the lifting shaft 14, the first link 15, the second link 16, and the hand 10) included in the robot around their respective axes. Each actuator is configured as an electric motor 3 shown in FIG. 3.

Each electric motor 3 is electrically connected to the control device 5 via a drive device such as a driver (not shown) or the like. The controller 5 outputs control commands (commanded rotation position) or the like to the driver to control the rotation of the electric motor 3.

The posture detector 12 includes a plurality of rotation sensors 12a. For example, an encoder constitutes the rotation sensors 12a. Each rotation sensor 12a detects a rotation position of each electric motor 3 that drives the hand 10, the first link 15, and the second link 16, respectively. Each rotation sensor 12a is electrically connected to the controller 5 and transmits the detected rotation position to the controller 5.

The controller 5 is configured as a known computer including a CPU, a ROM, a RAM, an auxiliary storage device, etc. The auxiliary storage device is configured as, for example, an HDD, an SSD, etc. The auxiliary storage device stores robot control programs, etc. for controlling the robot 1. The robot control programs include a slip determination program for realize the steps of the slip determination method of the present invention.

The controller 5 outputs the commanded rotation position, or the like to each electric motor 3 that drives each part of the above described robot 1 in accordance with a predetermined operation program, a movement command that is input from the user, or the like. The controller 5 controls to move the hand 10 to a predetermined command position.

The positional displacement detection device 8 is constituted by, for example, a pre-aligner (wafer aligner). As shown in FIG. 1, the positional displacement detection device 8 includes a rotating base 81 and a line sensor 8.

The rotating base 81, can allow the wafer 2 to be rotated by an electric motor (not shown), etc. The rotating base 81 rotates with the wafer 2 placed thereon. The rotating base 81 is formed, for example, in a columnar shape.

The line sensor 82 is constituted by, for example, a transmissive sensor including a light emitting part and a light receiving part. The light emitting part and light receiving part are arranged so as to face each other, at a predetermined interval in the vertical direction. The line sensor 82 emits the detection light through the light emitting part arranged in a radial direction of the rotating base 81, and receives the detected light through the light receiving part provided below the light emitting part. The detected light may be, for example, laser light. When the wafer 2 is placed on the rotating base 81, its outer edge is located between the light emitting part and the light receiving part.

The line sensor 82 is electrically connected to, for example, the controller 5. The line sensor 82 transmits a detection result of the light receiving part to the controller 5. The change in the detection result of the light receiving part when the rotating base 81 rotates depends on a shape of the outer edge of the wafer 2. With the shape of such outer edge, the positional displacement in which the center of the wafer 2 is displaced from a center of the rotating base 81 can be detected. Therefore, in the positional displacement detection device 8, the detecting reference position of the positional displacement is the center of the rotating base 81. The controller 5 acquires the actual positional displacement amount of the wafer 2 based on the detection result of the light receiving part.

Next, taking the determination when the wafer is taken out as an example, the determination of slip occurrence by the robot system 100 of this embodiment will be described in detail. The slip of the wafer 2 is prone to occur when the wafer is taken out.

Incidentally, the determination of slip occurrence by the robot system 100 of this embodiment can be performed at any timing in the process in which the robot 1 transporting the wafer 2 by the hand 10. That is, the transfer of the wafer 2 by the robot 1 can be considered to be a series of operations from the removal of the wafer 2 at one location by the hand 10 to the placement of the wafer 2 at another location. Whether or not slippage occurs can be determined at any timing from the start to the end of the series of operations.

Depending on the process performed on the wafer 2, the surface of the wafer 2 may have adhesiveness. For example, when the wafer 2 is removed from the storage device 6 by the robot 1, the wafer 2 may appear to try to stay there as if it is be stuck to the storage device 6. As a result, slippage occurs between the wafer 2 and the hand 10 as the wafer 2 is taken out by the hand 10, and the position of the wafer 2 relative to the hand 10 is displaced.

The robot system 100 of this embodiment, during operation of the robot 1, uses the controller 5 to monitor information. The information relate to the current flowing through each of the electric motor 3 for driving each part of the robot 1, the position of the electric motor 3, the position deviation, the velocity and the acceleration of the electric motor 3, the velocity deviation, and the acceleration deviation or the like. In the following description, the position, the velocity and the acceleration with respect to the electric motor 3 means a rotational position, a rotational velocity and a rotational acceleration, unless otherwise stated.

The current value of each electric motor 3 is measured, for example, by a current sensor provided in a motor drive circuit (not shown). The position of the electric motor 3 can be obtained, for example, based on a measured value of the rotation sensor 12a described above. The velocity and the acceleration of the electric motor 3 can be obtained, for example, by time differentiating the measured value of the rotation sensor 12a. The position deviation, the speed deviation, and the acceleration deviation can be obtained by calculating a difference between the above-described position, velocity, acceleration and a target position, a target speed, a target acceleration.

In the robot system 100 of this embodiment, when the robot 1 removes the wafer 2 from the storage device 6, the controller 5 determines whether the wafer 2 slipped or not, based on the current value or the like of the electric motor 3.

In the following, the determination of the slip in the control device 5 will be described in detail taking the current value shown in FIG. 4 and the position deviation shown in FIG. 5 as an example. In FIG. 4A, FIG. 4B and FIG. 5A, FIG. 5B, graphs are shown with each value is plotted on the vertical axis and time is plotted on the horizontal axis. FIG. 4A, FIG. 4B and FIG. 5A, FIG. 5B show data of a predetermined period (e.g., 2, 3 seconds) when taking out the wafer 2. The graphs of FIG. 4A, FIG. 4B and FIG. 5A, FIG. 5B are merely examples, and various waveforms may be considered depending on situations.

FIG. 4A is a graph showing the current value of the electric motor 3 in the case where no slippage occurs. FIG. 4B is a graph showing the current value of the electric motor 3 when the slippage occurs.

Comparing FIG. 4A and FIG. 4B, it can be seen that among the plurality of the electric motors 3 for driving each portion of the robot 1, the current value of at least one of the electric motor 3 has changed according to whether or not slippage occurs. For example, the current waveform flowing through the electric motor 3 for driving the joint of the second axis c2 has several spike portions in the positive direction or negative direction regardless of whether slippage occurs, but when the slippage occurs, the peaks of some spike portions are obviously increased.

The controller 5 acquires the current flowing through the electric motor 3 through the current sensor described above, and monitors the current (the first step). When the instantaneously increasing current value is too excessive as shown in FIG. 4B, the controller 5 determines that the slippage has occurred when the wafer 2 is taken out (the second step).

The determination of whether the current value is excessive can be simply performed by comparison with a predetermined current threshold value. Alternatively, the slip may be determined by comparing waveforms. Specifically, the controller 5 stores a reference waveform as appropriate when no slippage is occurring, compares the obtained current waveform with the reference waveform.

The controller 5 calculates the degree of deviation of the graph shape, and determines that slippage has occurred when the degree of deviation exceeds a threshold value. For example, the waveform in FIG. 4A can be adopted as the reference waveform.

The current flowing through the electric motor 3 is determined by a target value of the movement of the electric motor 3, and a measured value of the movement of the electric motor 3.

Therefore, if the occurrence of the slippage can be detected by the current, it is considered that the occurrence of the slippage can be similarly detected by the behavior of the position deviation, the velocity deviation, and the acceleration deviation of the electric motor 3.

FIG. 5 shows an example in the deviation of the rotational position. FIG. 5A is a graph showing the deviation of the rotational position when no slippage occurs. FIG. 5B is a graph showing the deviation of the rotational position when the slippage occurs.

As shown in FIG. 5B, when the slippage occurs, the transition of the position deviation of the electric motor 3 also shows characteristic behavior, such as the occurrence of large spike in the negative direction. It is considered that the occurrence of slippage can be determined by detecting the characteristic of the positional deviation using an appropriate method.

Although the examination showing the waveform is omitted, similarly, it is considered that the occurrence of slippage can be determined from the velocity deviation and the acceleration deviation of the electric motor 3.

As a cause of the waveform such as the current value to exhibit a behavior different from normal, it is considered various other than the slippage of the wafer 2. In this regard, the controller 5 of this embodiment only extracts the waveform of a limited period such as the current value when the wafer is taken out, and determines the presence or absence of slippage. At the time in which wafer is taken out, slippage of the wafer 2 is likely to occur. Therefore, erroneous determination regarding slippage can be suppressed.

In this embodiment, the controller 5 determines the slippage of the wafer 2 by software based on the current value or the like of the electric motor 3. Therefore, a special device such as a sensor is unnecessary, so that the configuration can be simplified. In addition, since it is not necessary to modify the hardware, it is easy to apply the present invention to an existing robot system.

In the robot system 100 of this embodiment, the controller 5 determines whether or not slippage occurs as described above. If it is determined that no slippage occurs, the controller 5 operates the robot 1 so as to directly convey the wafer 2 from the storage device 6 to the unillustrated processing apparatus (the first route R1). If it is determined that slippage has occurred, the controller 5 operates the robot 1 to first transfers the wafer 2 from the storage device 6 to the positional displacement detection device 8, and then transfer the wafer 2 from the positional displacement detection device 8 to the unillustrated processing apparatus (the second route R2). In FIG. 1, the first route R1 and the second route R2 are conceptually shown by arrows.

If slippage occurs in the wafer 2, the position of the wafer 2 will be displaced respect to the hand 10. When the robot 1 transfers the wafer 2 to the positional displacement detection device 8 according to the second route R2, a displacement occurs between the center of the placed wafer 2 and the rotational center of the rotating base 81 accordance with the above-described displacement. The size and direction of this displacement is detected by the positional displacement detection device 8. The robot 1, at a position capable of offsetting the acquired displacement, takes out the wafer 2 from the rotating base 81 by the hand 10 and transports the wafer 2 to the processing apparatus of the transfer destination. In this way, the slippage of the wafer 2 can be corrected, and the wafer 2 can be correctly transported to the processing apparatus in a state where there is no positional displacement.

In this embodiment, since the slippage of the wafer 2 is detected by monitoring such as the current value of the electric motor 3, it is possible to detect the slippage almost in real time. Therefore, immediately after removing the wafer 2 from the storage device 6 (e.g., the state of FIG. 1), the controller 5 is in a state of completing the determination of whether the slippage has occurred. When the controller 5 determined that slippage has occurred, the controller 5 can switch the transfer route of the wafer 2 in situ so as to transfer the wafer 2 to the positional displacement detection device 8.

If all the wafer 2 are transported via the positional displacement detection device 8, the transfer tact time would increase greatly. However, in this embodiment, since the second route R2 is adopted only when the slippage of the wafer 2 is detected, it is possible to prevent the unnecessary detecting of no displacement. In addition, since there is no need to specially operate the robot 1 to detect slippage, the increase of the transport tact time is substantially zero in the case of the first route R1. Thus, the robot system 100 of this embodiment can transfer the wafer 2 efficiently while corresponding to irregularly occurring slippage.

As described above, the robot system 100 of this embodiment includes the robot 1 and the controller 5. The robot 1 has one or more joints driven by the electric motor 3, and capable of holding the wafer 2 by the hand 10. The controller 5 gives commands to the robot 1 to control it. When the robot 1 holds and transports the wafer 2 with the hand 10, the controller 5 determines whether or not slippage has occurred between the hand 10 and the wafer 2 based on information about the electric motor 3.

Accordingly, it allows immediate determination of the occurrence of slippage between the hand 10 of the robot 1 and the held wafer 2 without requiring a special detection device and without the need for special movements of the robot 1.

In the robot system 100 of this embodiment, the controller 5 determines an occurrence of slippage based on the information related to the electric motor 3 obtained during the predetermined period when the hand 10 takes out the wafer 2.

Accordingly, since the occurrence of slip is determined based only on the information obtained during the period in which the slippage is likely to occur, erroneous determination can be prevented.

In the robot system 100 of this embodiment, the information for determining the presence or absence of the slippage include at least any one of the following: the current value, the position deviation, the velocity deviation, and the acceleration deviation of the electric motor 3.

Accordingly, it is possible to appropriately determine whether or not slippage occurs.

The robot system 100 of this embodiment includes the positional displacement detection device 8 capable of detecting the positional deviation of the wafer 2. The controller 5 controls the robot 1 to transport the wafer 2 by the first route R1 that does not go through the positional displacement detection device 8 when it is determined that no slippage has occurred. The controller 5 controls the robot 1 to transport the wafer 2 by the second route R2 that go through the positional displacement detection device 8 when it is determined that the slippage has occurred.

Accordingly, the wafer 2 can be correctly transported efficiently while correcting the position of the wafer 2 according to the occurrence of the slippage.

Next, a variation of the present invention will be described. In the description of the variation, members identical or similar to those of the above-described embodiment may not be described and instead the same reference signs as in the above-described embodiment are given on the drawings.

In the robot system 100 of this variation, the controller 5 determines whether or not slippage has occurred as described above during the transportation of the wafer. When it is determined that no slippage has occurred, the controller 5 sets the transfer route of the wafer 2 to the first route R1. When it is determined that the slippage has occurred, the controller 5 sets the transfer route of the wafer 2 to the second route R2.

The determination of whether or not the slippage has occurred can be performed based on the current value of the electric motor 3, as described in the above embodiment. However, it is not limited thereto. For example, the slippage can be calculated based on an analysis result of an image obtained by photographing the wafer 2 being transported with a camera (not shown). The analysis of the image can be performed by the controller 5 or by a computer separate from the controller 5.

The transfer route of the wafer 2 can be switched based on the slippage amount instead of determining whether or not slippage has occurred. The slippage amount can be obtained by analyzing the image taken by the camera. The controller 5 compares the calculated slippage amount with a preset threshold value, to determine whether or not to switch the transfer route of the wafer 2.

When the slippage amount is equal to or less than the threshold value, since the positional deviation of the wafer 2 with respect to the hand 10 is within the allowable range, the wafer 2 is transported by the first route R1 as originally scheduled. When the slippage amount exceeds the threshold value, the transfer route of the wafer 2 is changed to the second route R2.

For detection of slippage of the wafer 2, an optical sensor (not shown) provided on the device side can be used instead of the camera, for example. The optical sensor is disposed at an appropriate position in the transport path of the wafer 2. If the slippage occurs in the wafer 2, the optical sensor detects the wafer 2 being transported at a different timing from normal. This makes it possible to determine whether or not slippage has occurred.

As the optical sensor, it is also possible to use a line sensor capable of detecting the outer edge of the wafer 2 being transported. In this case, the slippage amount of the wafer 2 can be obtained.

While the preferred embodiment and the variation embodiment of the present invention have been described above, the above configuration can be changed, for example, as follows.

It is not limited to the slippage when the robot 1 takes out the wafer 2 from the transfer source, the slippage when placing the wafer 2 to the transfer destination can also be detected. If slippage is detected when placing the wafer 2 to the transfer destination, it is preferable that the controller 5 controls the robot 1 to take out the wafer 2 placed at the transfer destination again and transfer it to the positional displacement detection device 8, then place the wafer 2 to the transfer destination again after correcting the displacement.

The controller 5 may determine the presence or absence of the slippage from not only one but a combination of several factors such as the current value and the position deviation or the like of the electric motor 3. When the wafer 2 is transported by the hand 10, in most cases, each of the plurality of joints is driven by the electric motor 3. Therefore, it is also conceivable to determine the presence or absence of the slippage by combination of the information such as the current value in the plurality of electric motors 3.

In the embodiment described above, the controller 5 determines whether or not slippage has occurred. However, it is considered that the waveform of the current value and the like may differ between the case where the slippage of the wafer 2 is 1 mm and the case where the slip is 10 mm, for example. Therefore, there is leeway for quantitatively determining the size of the slippage by monitoring the current value or the like. It is also possible to make a learning model estimate the size of the slippage from the waveform by machine learning the relationship between the waveform such as the current value and the size of the occurred slippage.

In the embodiment described above, the controller 5 determines whether or not the slippage has occurred based on the information about the electric motor. Alternatively or additionally, the controller 5 may estimate the slippage amount of the wafer 2 relative to the hand 10 based on the information about the electric motor. The slippage amount can be calculated based on a period in which the value relating to the information such as the current value is continuously excessive, and the amount of movement of the robot 1 in the period, for example. After estimating the slippage amount, the controller 5 may determine whether or not the slippage has occurred based on a result of comparing the obtained slippage amount with the predetermined threshold value.

If automatic correction of the positional deviation is not necessary, the positional displacement detection device 8 can be omitted.

DESCRIPTION OF THE REFERENCE NUMERALS 1 robot
2 wafer
3 electric motor
5 controller (control part)
8 positional displacement detection device
10 hand (holding part)
100 robot system
R1 first route
R2 second route

The invention claimed is:

1. A robot system comprising:
a robot having one or more joints driven by an electric motor, and capable of holding a wafer by a holding part; and
a control part for controlling the robot by giving commands to the robot, wherein
when the robot holds and transports the wafer with the holding part, the control part performs at least one of the following: determining whether or not slippage has occurred between the holding part and the wafer bases on information about the electric motor, and estimating an amount of slippage of the wafer relative to the holding part.

2. The robot system according to claim 1, wherein
the control part determines an occurrence of slippage bases on the information related to the electric motor obtained during a predetermined period when the holding part takes out the wafer.

3. The robot system according to claim 1, wherein
the information include at least any one of the following: current value, position deviation, velocity deviation, and acceleration deviation of the electric motor.

4. The robot system according to claim 3, further comprising:
a positional displacement detection device capable of detecting a positional deviation of the wafer, wherein
the control part controls the robot to transport the wafer by a first route that does not go through the positional displacement detection device when it is determined that no slippage has occurred, and
the control part controls the robot to transport the wafer by a second route that go through the positional displacement detection device when it is determined that the slippage has occurred.

5. A robot system comprising:
a robot having one or more joints driven by an electric motor, and capable of holding a wafer by a holding part;
a control part for controlling the robot by giving commands to the robot; and
a positional displacement detection device capable of detecting a positional deviation of the wafer, wherein
the control part switches a transfer route of the wafer between a first route and a second route bases on a determination result of whether or not slippage has occurred between the holding part and the wafer during a transfer of the wafer, or bases on a slippage amount, the first route which does not go through the positional displacement detection device, the second route which dose go through the positional displacement detection device.

6. A slip determination method determines occurrence of slippage between a wafer and a holding part in a robot system including a robot and a control part, the robot has one or more joints driven by an electric motor, and capable of holding the wafer by the holding part, the control part controls the robot by giving commands to the robot, the slip determination method comprising:
a first step in which the control part acquires information about the electric motor when the wafer is held and transported by the holding part; and a second step in which the control part determines whether or not slippage has occurred bases on the information.

\* \* \* \* \*